United States Patent [19]

Sipos et al.

[11] Patent Number: 5,043,041

[45] Date of Patent: Aug. 27, 1991

[54] RELEASE SHEET FOR PRINTED CIRCUIT BOARD MANUFACTURE

[75] Inventors: Peter A. Sipos, Kingston; Erica M. Besso, Manotick, both of Canada

[73] Assignee: Du Pont Canada Inc., Mississauga, Canada

[21] Appl. No.: 538,641

[22] Filed: Jun. 14, 1990

Related U.S. Application Data

[62] Division of Ser. No. 266,878, Nov. 2, 1988, Pat. No. 4,966,960.

[30] Foreign Application Priority Data

Nov. 2, 1987 [GB] United Kingdom ............... 8725746

[51] Int. Cl.$^5$ .............................................. B32B 31/00
[52] U.S. Cl. ................................... 156/247; 156/289; 524/606; 528/335
[58] Field of Search .............. 156/289, 247; 524/606; 528/335

[56] References Cited

U.S. PATENT DOCUMENTS

| | | | |
|---|---|---|---|
| 2,705,227 | 3/1955 | Stamatoff | 260/45.7 |
| 4,399,556 | 7/1982 | Baer | 523/220 |
| 4,730,016 | 3/1988 | Fujii et al. | 524/96 |
| 4,786,678 | 11/1988 | Dobreski et al. | 524/528 |
| 4,810,745 | 3/1989 | Pike et al. | 524/516 |

FOREIGN PATENT DOCUMENTS 1530257 11/1975 United Kingdom ................. 77/02

OTHER PUBLICATIONS

Derwent 79-02956B/02 (JAP. 53-136084 11/28/78).
Derwent 80-33584C/19 (JAP 55-042839 3/26/80).

*Primary Examiner*—William A. Powell
*Assistant Examiner*—James J. Engel, Jr.

[57] ABSTRACT

A process and nylon release sheet for manufacturing printed circuit boards from epoxy prepregs is disclosed. In such process layers of the prepregs are separated from one another by a release sheet. The release sheet comprises an aliphatic or aromatic nylon or nylon copolymer which is a condensation product of a dicarboxylic acid and a diamine. The nylon film contains a heat stabilizer and an inorganic particulate antiblock additive, e.g. diatomaceous earth, glass beads, amorphous silica, talc, mica and molybdenum disulphide. The nylon may be toughened by the addition of a phosphorus-containing catalyst or an epoxide.

7 Claims, No Drawings

RELEASE SHEET FOR PRINTED CIRCUIT BOARD MANUFACTURE

This is a division of application Ser. No. 07/266,878, filed Nov. 2, 1988, now U.S. Pat. No. 4,966,960.

The present invention relates to the manufacture of printed circuit boards from epoxy prepregs. The term "prepreg" is known in the art as meaning a reinforcement material impregnated with resin which has undergone a partial cure. Such prepreg, also known as B-stage, contains resin in a metastable state. Printed circuit boards consist of laminates of such prepregs which have been subjected to a final cure.

A printed circuit board may comprise a copper foil adhered to a cured prepreg. Optionally, the copper foil may be on both sides of the cured prepreg. Several processes are known for the manufacture of printed circuit boards. For example, "books" of a multiplicity of layers of copper foil, glass-reinforced epoxy prepreg and a release sheet are placed between stainless steel sheets having mirror surfaces, and pressed together at an elevated temperature in a hydraulic press. In another process the "book" is placed in a bag which is evacuated and the whole is autoclaved. Processes such as these, and others, are disclosed, for example in Japanese Unexamined Kokai No. 53136084 to Fujitsu Ltd. and Japanese Unexamined Kokai No. 55042839 to Toshiba Chemical K.K.

The function of the release film in such processes is two-fold. The first is to prevent epoxy resin from adhering to the stainless steel sheets. The second is to prevent adjacent printed circuit boards from being bound together as a result of epoxy resin being squeezed out at the perimeters of the boards.

When release sheets are used in such processes, it is desirable that the sheet be able to be stripped away, easily, from the cured glass-reinforced epoxy resin, without shredding. It is important, therefore that the release sheet not be degraded or embrittled during the time that the epoxy prepreg is being cured, at elevated temperatures, e.g. about 175° C. for 1 hour. Release sheets that have been used in the manufacture of printed circuit boards from epoxy prepregs include cellulose acetate films, fluorinated films, and polyester films. Some of these films, however, have a tendency to shred upon being pulled from the cured epoxy resin.

It has now been found that certain nylon-based compositions may be used in high temperature applications. For example, it has been found that certain nylon-based films may be used as release sheets.

Accordingly the present invention provides a nylon composition selected from i) a condensation product of a dicarboxylic acid and a diamine and ii) a copolymer of such condensation product, wherein said nylon composition contains an inorganic particulate anti-block additive and a heat stabilizer, and wherein the nylon composition has an effective relative viscosity of at least 50.

In a preferred embodiment the composition is in film form and is substantially unoriented.

The present invention also provides in a process for the manufacture of printed circuit boards from epoxy prepregs, wherein a release sheet is used in such manufacture, an improvement wherein the release sheet is formed from a nylon composition selected from i) a condensation product of a dicarboxylic acid and a diamine and ii) a copolymer of such condensation product, wherein said nylon contains effective amounts of an inorganic particulate anti-block additive and a heat stabilizer, and wherein the release sheet has an effective relative viscosity of at least 50 and is substantially unoriented.

The nylon may be aliphatic or aromatic. Preferably the nylon is a condensation product of a $C_4$ to $C_{12}$ dicarboxylic acid and a $C_4$ to $C_{12}$ diamine.

Most preferably the nylon is nylon 66.

In preferred embodiments the nylon has been "toughened" by the addition of a) a phosphorus containing catalyst or b) an epoxide cross-linking agent.

In yet other embodiments, the effective relative viscosity of the release sheet is at least 70.

Effective relative viscosity is the ratio of viscosity at 25° C. of an 8.4 wt % solution of the nylon composition in 90 wt % formic acid (90% acid to 10% water) to the viscosity at 25° C. of the 90 wt % formic acid alone.

The inorganic particulate anti-block additive may be selected from known anti-block additives. Such additives are finely divided, e.g. less than about 10 μm in the largest dimension. Moreover, such additives may be randomly shaped or spherical, e.g. diatomaceous earth, glass beads, amorphous silica, or lamellar, e.g. talc, mica, molybdenum disulphide. It is preferred that the anti-block additive be present in a concentration of at least 0.05 wt %. More preferably, it is in a concentration of from 2.5 to 30.0 wt %, especially from 2.5 to 10.0 wt %, and more especially from 2.5 to 5.0 wt %.

The heat stabilizer may be an additive known to protect nylons from degradation at elevated temperatures. For example, U.S. Pat. No. 2,705,227 to G. S. Stamatoff which issued Mar. 29, 1955 discloses that a combination of a copper compound and an inorganic halide is useful as a heat stabilizer. Suitable copper compounds include copper salts of alkanoic acids, e.g. acetic, butyric, lauric, palmitic and stearic acids. Suitable inorganic halides include alkali metal halides, particularly sodium and potassium bromides or iodides. When such heat stabilizers, i.e. copper compounds and inorganic halides are used in the present invention, the effective concentration range is from 10 to 100 ppm copper in the release sheet. Below 10 ppm the release sheet tends to become brittle and will not peel away from the cured epoxy without splitting. Above 100 ppm the release sheet tends to stick to the cured epoxy, i.e. poor release characteristics are observed. The preferred heat stabilizer is a combination of cupric acetate and potassium bromide. The preferred amount of copper in the stabilizer is from 15 to 50 ppm, especially from 20 to 30 ppm.

Another class of heat stabilizers are known for their antioxidant properties in polymers, some of which have been found useful in nylons, and some of which have particular activity in other polymers, e.g. polyolefins. Such antioxidants are hindered phenolic antioxidants, or a mixture of a hindered phenolic antioxidant with a secondary antioxidant or stabilizer. The ratio of phenolic antioxidant to secondary antioxidant or stabilizer may be in the range of 0.25:1 to 1:2 with the total concentration of antioxidant being in the range of 200 to 800 ppm. Examples of suitable hindered phenolic antioxidants are 1,3,5-trimethyl-2,4,6,tris(3,5-di-tertbutyl-4-hydroxybenzyl)benzene, octadecyl-3,5, di-tert-butyl-4-hydroxy cinnamate, tetrakis-methylene-3-(3,5-di-tert-butyl-4-hydroxy-phen yl)propionate methane, octadecyl -3-(3,5-di-tert-butyl-4-hydroxyphenyl)propionate 2,5-ditert-butyl hydroquinone, 2,2-methyl-bis-(4-methyl-6-tert-butyl phenol), 2,2methylene-bis-(4-ethyl-6-tert-buyl phenol), 4,4-butylidene-bis(6-tert-butyl-m- cresol) and N,N-hexamethylene bis(3,5-di-tert-butyl-4-hydroxyhydrocinnamamide). Examples of secondary antioxidants are di (stearyl)-pentaerythritol diphosphite, tris(2,4-di-tert-butyl phenyl)phosphite, dilauryl thiodipropionate and bis (2,4,-di-tert-.butyl) pentaerythritol diphosphite. A preferred antioxidant is sold under the trade mark Irganox B 1171, and is a 1:1 mixture of N,N-hexamethylenebis(3,5-di-tert-butyl-4-hydroxy-hydrocinnamamide) and tris(2,4 di-tert-butylphenyl)-phosphite. The preferred concentration of antioxidant is from 400 to 600 ppm.

It is especially preferred that the nylon be toughened, in other words, that its energy-to-break be increased. This may be accomplished by the addition of a phosphorus-containing catalyst or the addition of an epoxide crosslinking agent prior to extrusion into film.

Toughening with an epoxide may be accomplished by a method which relies upon the addition of from 0.01 to 2 wt % of the epoxide and up to 0.5 wt % of an acidic catalyst. The epoxide is selected from the group consisting of polyglycol diepoxides, bisphenol-A diepoxides, glycidyl ethers, tetraglycidyl esters and bisphenol-F diepoxides. The acidic catalyst is selected from the group consisting of sodium hypophosphite, manganese hypophosphite, ortho-phosphoric acid, sodium phenyl phosphate, phosphine/boron trifluoride complex, potassium phosphate, potassium hydroxide and aliphatic carboxylic acids, and mixtures thereof. The epoxide and acidic catalyst are added to the nylon in the melt processing apparatus, i.e. extruder, prior to extrusion into film form. The relative viscosity of the nylon, prior to addition to the extruder may be as low as 30, depending on whether the extruder is vented or not, the temperature of extrusion, the particular nylon used, the concentrations of epoxide and acidic catalyst added, and the desired properties of the resultant film. The relative viscosity of the resultant film must be higher than 50 and is preferably higher than 80.

It is preferred that the epoxide be of low molecular weight, e.g. less than 1000. The concentration of epoxide may be from 0.01 to 2 wt %, and is preferably from 0.05 to 2 wt %, especially from 0.1 to 1.5 wt %. The epoxide may be coated onto pellets, flake or the like form of nylon prior to introduction into the extruder, it may be previously incorporated into a portion of the nylon by melt blending techniques, or it may be injected directly into the extruder.

It is preferred that the concentation of acidic catalyst be from 0.01 to 1.0 wt %, especially from 0.05 to 0.2 wt %. The preferred acidic catalyst is sodium hypophosphite.

Oxygenated phosphorus compounds suitable as catalysts in the present invention include phosphorous acid, phosphonic acid, alkyl and aryl substituted phosphonic acid, hypophosphorous acid, alkyl, aryl and alkyl/aryl substituted phosphonic acid, phosphoric acid, and the alkyl, aryl and alkyl/aryl esters, metal salts, ammonium salts and ammonium alkyl salts of these phosphorus-containing acids. Preferred compounds are the salts of phosphorous acid, phosphonic acid, hypophosphorous acid, phosphinic acid and phosphoric acid which are formed by combining any cation with any of these acids. Preferred cations are univalent metal and ammonium ions. More preferred are the neutral salts of these acids, such as the dibasic salts of alkali metals, e.g. sodium, lithium or sodium/lithium dibasic salts. Sufficient catalyst is employed to promote polymerization of the nylon. Typically the concentration of catalyst is from 0.0001 to 1 wt %, preferably from 0.01 to 1 wt %, especially from 0.05 to 0.5 wt %. Oxygenated phosphorus compounds suitable as catalysts may also be selected from the group of compounds of formula:

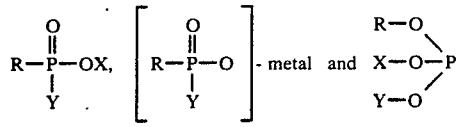

wherein R is selected from the group consisting of alkyl, cycloalkyl, aryl and arylalkyl, X and Y are independently selected from hydrogen, alkyl, cycloalkyl, aryl and arylalkyl, n is a whole number corresponding to the valence of the metal.

Such compounds must be present in amounts of at least 0.01 wt %, preferably from 0.01 to 3.0 wt. %, especially from 0.1 to 0.5 wt %. Examples of such compounds include phenylphosphinic acid, diphenyl phosphinic acid, sodium phenylphosphinate, calcium phenylphosphinate, sodium 3-pentylphosphinate, dimethylphosphinate, triphenyl phosphite, diphenyl phosphite, dimethylphenyl phosphite and ethyldiphenyl phosphite.

Oxygenated phosphorus compounds suitable as catalysts should be capable of generating phosphoric acid during the melt extrusion process. Preferably the catalyst is selected from the group consisting of hypophosphorous acid, phosphoric acid, phosphonic acid, phosphonic acid esters, phosphoric acid esters and hypophosphorous acid esters and metallic salts thereof. The preferred catalysts are hypophosphorous acid and phosphoric acid.

The catalyst may be added to the nylon at any time prior to feeding the nylon to the film extruder. For example it may be added in the early stages of the nylon manufacture, e.g. in nylon salt solution prior to evaporation of the water or removal of the water of condensation. Alternatively, it may be injected into the barrel of the extruder.

The film of the present invention, useful as a release sheet, may be extruded as a flat sheet. In use, "books" of copper foil, glass-reinforced epoxy prepreg and release sheet laminates are formed in the manner described hereinafter. Optionally there may be a second copper foil between the epoxy prepreg and the release sheet. The number of laminates in a book varies.

In one process, the book is placed between the steel plates of a hydraulic press. By heating such plates, the book assembly is brought to temperatures from 170° to 200° C., usually about 175° C. for a period of 45 to 90 mins., usually about 60 mins., in order to cure the epoxy resin. After cooling the book and removing it from the press, the laminates may be separated. With laminates having copper foil on both sides of the glass-reinforced epoxy, release sheets are also required because the resin oozes from the edges of the prepregs. In another process the book is placed between steel plates, placed in a heat-stable bag, and the bag is evacuated to a pressure of about 150 KPa. The evacuated bag, containing the book is placed in an autoclave and the epoxy is cured at temperatures and times similar to that for the other process described hereinabove.

It has been found that release sheets containing from 2.5 to 10 wt % amorphous silica are preferred, for their release properties.

The invention may be illustrated by reference to the following Examples.

EXAMPLE 1

Several nylon 66-based compositions containing a range of concentrations of a diepoxide toughening component were cast into film. The compositions were heat stabilized using cupric acetate and potassium bromide.

Release performance was evaluated qualitatively after a cure of 1 hour at 175° C. The numerical scale used ranges from 1 (excellent release) to 10 (poor release). In some cases, release performance was also evaluated quantitatively by measuring the Peel Strength (ASTM No. D-903), in grams per centimeter width, of samples which had undergone a similar cure cycle. Values of peel strength less than to 40 g/cm are indicative of very good release.

Values for polyvinylfluoride (PVF) film are also shown for reference. Polyvinylfluoride film is one of the industry standards in these release applications, but it tends to embrittle and degrade at the temperatures of interest.

| Composition | 1 | 2 | 3 | 4 | 5 | 6 | 7 | PVF |
|---|---|---|---|---|---|---|---|---|
| Diepoxide, % | 0.05 | 0.06 | 0.1 | 0.2 | 0.2 | 0.3 | 0.3 | — |
| Catalyst, ppm | 100 | 120 | 200 | 400 | 400 | 600 | 600 | — |
| Silica, % | 2.5 | 5 | 2.5 | 2.5 | 3 | 2.5 | 0 | — |
| Copper, ppm | 18 | 18 | 18 | 18 | 20 | 18 | 18 | — |
| Release rating | 2 | 2 | 1 | 1 | 2 | 2 | 3 | 1 |
| Peel Strength | — | 31 | — | — | 24 | — | — | 4.7 |

EXAMPLE 2

Nylon 66-based compositions toughened with orthophosphoric acid (o-$H_3PO_4$) were cast into film and tested for release on epoxy prepregs cured as described in Example 1. The compositions were heat stabilized using cupric acetate and potassium bromide. The release rating scale is as described in Example 1. The relative viscosity was measured by the capillary method, using 8.4% formic acid solutions of the dried film.

| Composition | 8 | 9 | PVF |
|---|---|---|---|
| o-$H_3PO_4$, % | 0.05 | 0.1 | — |
| Silica, % | 3 | 3 | — |
| Copper, ppm | 18 | 18 | — |
| Effective Relative Viscosity | 86.7 | 99.8 | — |
| Release rating | 2 | 2 | 1 |

EXAMPLE 3

Several nylon-66 based compositions, containing varying concentrations of heat stabilizer were cast into film. Cupric acetate and potassium bromide were used as the heat stabilizer. Release performance rating was determined as described in Example 1. Peel strength units are g/cm width.

| Composition | 10 | 11 | 12 | 13 | 14 | PVF |
|---|---|---|---|---|---|---|
| Silica, % | 5 | 5 | 5 | 5 | 5 | — |
| Copper, ppm | 0 | 25 | 50 | 100 | 200 | — |
| Release rating | 8 | 3 | 4 | 5 | 5 | 1 |
| Peel strength | — | 51 | 98 | — | 120 | 4.7 |

We claim:

1. In a process for the manufacture of printed circuit boards from prepregs of a reinforcing material impregnated with a curable resin, comprising placing a release sheet on at least one side of said prepreg, curing the resin, and stripping away the release sheet from the prepreg, the improvement wherein the release sheet is formed from a nylon composition selected from the group consisting of i) a condensation product of a dicarboxylic acid and a diamine and ii) a copolymer of such condensation product, wherein said nylon composition contains effective amounts of an inorganic particulate anti-block additive and a heat stabilizer, and wherein the release sheet has an effective relative viscosity of at least 50 measured as the ratio of the viscosity of an 8.4 weight percent solution of the nylon composition at 25° C. in 90 weight percent formic acid to the viscosity of the 90 weight percent formic acid alone and is substantially unoriented.

2. A process according to claim 1 wherein the nylon has been toughened by the addition of a phosphorus-containing catalyst selected from the group consisting of hypophosphorous acid, phosphoric acid, phosphonic acid, phosphonic acid esters and metallic salts thereof.

3. A process according to claim 1 wherein the nylon has been toughened by the addition of an epoxide cross-linking agent selected from 0.01 to 2 wt % of the epoxide and up to 0.5 wt % of an acidic catalyst; the epoxide being selected from the group consisting of polyglycol diepoxides, bisphenol-A diepoxides, glycidyl ethers, tetraglycidyl esters, and bisphenol-F diepoxides; and the acidic catalyst being selected from the group consisting of sodium hypophosphite, manganese hypophosphite, orthophosphoric acid, sodium phenyl phosphate, phosphine/boron trifluoride complex, potassium phosphate, potassium hydroxide and aliphatic carboxylic acids, and mixtures thereof.

4. A process according to claim 1 wherein the anti-block additive is selected from diatomaceous earth, glass beads, amorphous silica, talc, mica and molybdenum disulphide.

5. A process according to claim 1 wherein the heat stabilizer is a combination of a) a copper salt of an alkanoic acid and b) an inorganic halide.

6. A process according to claim 1 wherein the heat stabilizer is an antioxidant selected from hindered phenolic antioxidants, and a mixture of a hindered phenolic antioxidant and a secondary antioxidant.

7. A process according to claim 6 wherein the hindered phenolic antioxidant is selected from 1,3,5 trimethyl-2,4,6,tris(3,5-di-tert-butyl-4-hydroxybenzyl) benzene, octadecyl-3,5,di-tert-butyl-4-hydroxy cinnamate, tetrakis-methylene-3-(3,5-di-tert-butyl-4-hydroxy-phenyl) propionate methane, octadecyl-3-(3,5-di-tert-butyl-4-hydroxyphenyl)propionate, 2,5-di-tert-butyl hydroquinone, 2,2-methyl-bis-(4-methyl-6-tert-butyl phenol), 2,2-methylene-bis-(4-ethyl-6-tert-butyl phenol), 4,4-butylidene-bis(6-tert-butyl-m-cresol) and N,N-hexamethylene bis(3,5-di-tert-butyl-4-hydroxy-hydrocinnamamide and the secondary antioxidant is selected from di (stearyl)pentaerythritol diphosphite, tris(2,4-di-tert-butyl phenyl) phosphite, dilauryl thiodipropionate and bis (2,4-di-tert-butyl) pentaerythritol diphosphite.

* * * * *